United States Patent [19]

Rehn et al.

[11] 4,320,664
[45] Mar. 23, 1982

[54] THERMALLY COMPENSATED SILICON PRESSURE SENSOR

[75] Inventors: Larry A. Rehn, Rowlett; Roy W. Tarpley, Garland, both of Tex.

[73] Assignee: Texas Instruments Incorporated, Dallas, Tex.

[21] Appl. No.: 124,417

[22] Filed: Feb. 25, 1980

[51] Int. Cl.³ .......................... G01L 19/04; G01L 9/06
[52] U.S. Cl. ........................................ 73/708; 73/721; 73/727; 73/DIG. 4; 338/3; 338/4; 338/42
[58] Field of Search ........... 73/708, 721, 727, DIG. 4, 73/777, 719; 338/4, 3, 9, 42

[56] References Cited

U.S. PATENT DOCUMENTS

| | | | |
|---|---|---|---|
| 3,646,815 | 3/1972 | Martin et al. | 73/727 |
| 3,858,150 | 12/1974 | Gurtler | 73/777 |
| 3,936,789 | 2/1976 | Matzen et al. | 338/225 |
| 4,173,900 | 11/1979 | Tanabe et al. | 73/721 |

OTHER PUBLICATIONS

Pfann W. G. and R. N. Thurston, "Semiconducting Stress Transducers Utilizing the Transverse Shear Piezoresistance Effects", *Journal of Applied Physics*, vol. 32, No. 10, Oct. 1961, pp. 2,008–2,019.
Cheney, Robert L., "A Solid-State Strain Gage Vacuum Sensor", *SAE Automotive Engineering Meeting*, Paper No. 730577, May 1973, pp. 1,985–1,989.
Gieles, A. C. M. and G. H. J. Somers, "Miniature Pressure Transducers with a Silicon Diaphram", *Philipps Tech. Review*, 33, 14–20, No. 1, 1973, pp. 14–20.
Seto, John Y. W., "Piezoresistive Properties of Polycrystalline Silicon", *Journal of Applied Physics*, vol. 47, No. 11, Nov. 1976, pp. 4,780–4,783.
Clark, Samuel K. and Kensall D. Wise, "Pressure Sensitivity in Anisotropically Etched Thin—Diaphragm Pressure Sensors", *IEEE Transactions on Electron Devices*, vol. ED-26, No. 12, Dec. 1979, pp. 1,887–1,895.
Samaun, Kensall D. Wise and James B. Angell, "An IC Piezoresistive Pressure Sensor for Biomedical Instrumentation", *IEEE Transactions on Biomedical Engineering*, vol. BME-20, No. 2, Mar. 1973, pp. 102–109.
Sundaram, K. N., "Semiconductor Sensors for Automotive Instrumentation", *SAE Automotive Engineering Meeting*, Paper No. 730572, May 1973.
Hood, Robert B., "Automotive Semiconductor Pressure Sensors", *SAE Automotive Engineering Meeting*, Paper No. 760094, 1976.
Ko Wen, Hsiung, Jaroslav Hynececk and Scott F. Boettcher, "Development of a Miniature Pressure Transducer for Biomedical Applications", *IEEE Transaction on Electron Devices*, vol. ED-26, No. 12, Dec. 1979, pp. 1,896–1,905.

*Primary Examiner*—Donald O. Woodiel
*Attorney, Agent, or Firm*—Robert D. Marshall, Jr.; Leo N. Heiting; Melvin Sharp

[57] ABSTRACT

A semiconductor pressure sensor employing the piezoresistive effect of single crystal silicon resistors to measure the flexure of a semiconductor diaphragm. In the preferred embodiment, a Wheatstone bridge composed of a first pair of resistors disposed on the center of the diaphragm and a second pair of resistors disposed on the periphery of the diaphragm is employed. Due to the nature of the diaphragm flexure, the first and second pairs of resistors exhibit piezoresistivity in opposite directions enabling pressure measurement with greater sensitivity. The diaphragm is mounted on and supported by a silicon clamp ring. The diaphragm and the clamp ring together form a unitary semiconductor structure. Because the piezoresistive effect which serves as a measure of the diaphragm flexure and hence as a measure of the pressure difference across the diaphragm is temperature dependent, the sensor also includes a temperature sensitive resistor, forming a part of the same unitary semiconductor structure, which provides a measure of the temperature of the piezoresistive elements. This measure of temperature enables external circuitry to correct for the temperature dependence of the piezoresistive effect thereby providing a pressure measurement of greater accuracy.

10 Claims, 7 Drawing Figures

THERMALLY COMPENSATED SILICON PRESSURE SENSOR

BACKGROUND OF THE INVENTION

The present invention relates to semiconductor pressure sensors and specifically to such sensors which employ the piezoresistive effect of single crystal silicon structures. The basic semiconductor pressure device of the prior art includes a diaphragm portion, having one or more silicon resistor elements of a desired type conductivity, which flexes when a pressure differential is applied across the diaphragm. This diaphragm portion of the pressure sensor is surrounded by a clamp ring portion around the entire perimeter of the diaphragm portion. This clamp ring portion is much thicker and by providing mechanical stability for the pressure sensor enables rigid mechanical connection to the pressure sensor. This silicon pressure sensor is disposed in a housing which enables the production of a pressure differential across the faces of the diaphragm portion. The flexure of the diaphragm portion due to this pressure differential is measured via the change in resistance of the doped resistive element or elements of the diaphragm portion. This resistive change is due to the stress of the diaphragm flexure and is called the piezoresistive effect. Pressure sensors of this type have been described in a Gieles, A. C. M. and G. H. Somers "Miniature Pressure Transducers with a Silicon Diaphragm", Phillips Technical Review, 33, pages 14 through 20, 1973. One problem with silicon pressure transducers of this type is that the piezoresistive elements display resistive changes with temperature as well as the resistive changes with the flexure of the diaphragm.

SUMMARY OF THE INVENTION

The present invention involves a silicon pressure sensor of the type described above which further includes a temperature sensor disposed upon the same chip. This temperature sensor enables compensation for the temperature dependent resistive change in the piezoresistive sensing element.

One aspect of the present invention is embodied in a thermally compensated silicon pressure sensor comprising a single crystal of silicon having a diaphragm portion of a first type conductivity having a thickness permitting flexure when a pressure differential is applied thereacross and having one or more resistor elements of the opposite type conductivity disposed therein in a position for exhibiting piezoresistivity when the diaphragm is flexed and further having a clamp ring portion disposed around the entire perimeter of the diaphragm portion having a thickness permitting virtually no flexure and having a temperature sensitive resistor element disposed therein.

A further embodiment of the present invention comprises a thermally compensated silicon pressure sensor such as described above in which the one or more resistor elements comprise a continuous loop resistor element formed into a Wheatstone bridge in which each resistor element of a first pair of opposite arms of the Wheatstone bridge is disposed in a central portion of the diaphragm portion and in which each resistor of a second pair of opposite arms of the Wheatstone bridge is disposed in a peripheral portion of the diaphragm portion, further having electrical terminals disposed in ohmic contact with the continuous loop resistor element thereby defining the respective arms of the Wheatstone bridge.

A still further embodiment of the present invention comprises a thermally compensated silicon pressure sensor such as described above in which the temperature sensitive resistor element is a spreading resistance thermistor such as disclosed in U.S. Pat. No. 3,936,789, issued to Matzen et al, Feb. 3, 1976, and which is assigned to the same assignee of the present application.

Yet another embodiment of the present invention comprises a thermally compensated silicon pressure sensor having a silicon carbide diaphragm layer with one or more piezoresistive elements disposed thereon, having a polycrystalline silicon clamp ring and having a temperature sensitive resistor element disposed on the silicon carbide layer where it is supported by the clamp ring.

BRIEF DESCRIPTION OF THE DRAWINGS

The above and further objects and embodiments of the present invention will become clear in the following detailed description of the invention taken in conjunction with the drawings in which.

DETAILED DESCRIPTION OF THE PREFERRED EMBODIMENTS

Figure 1:
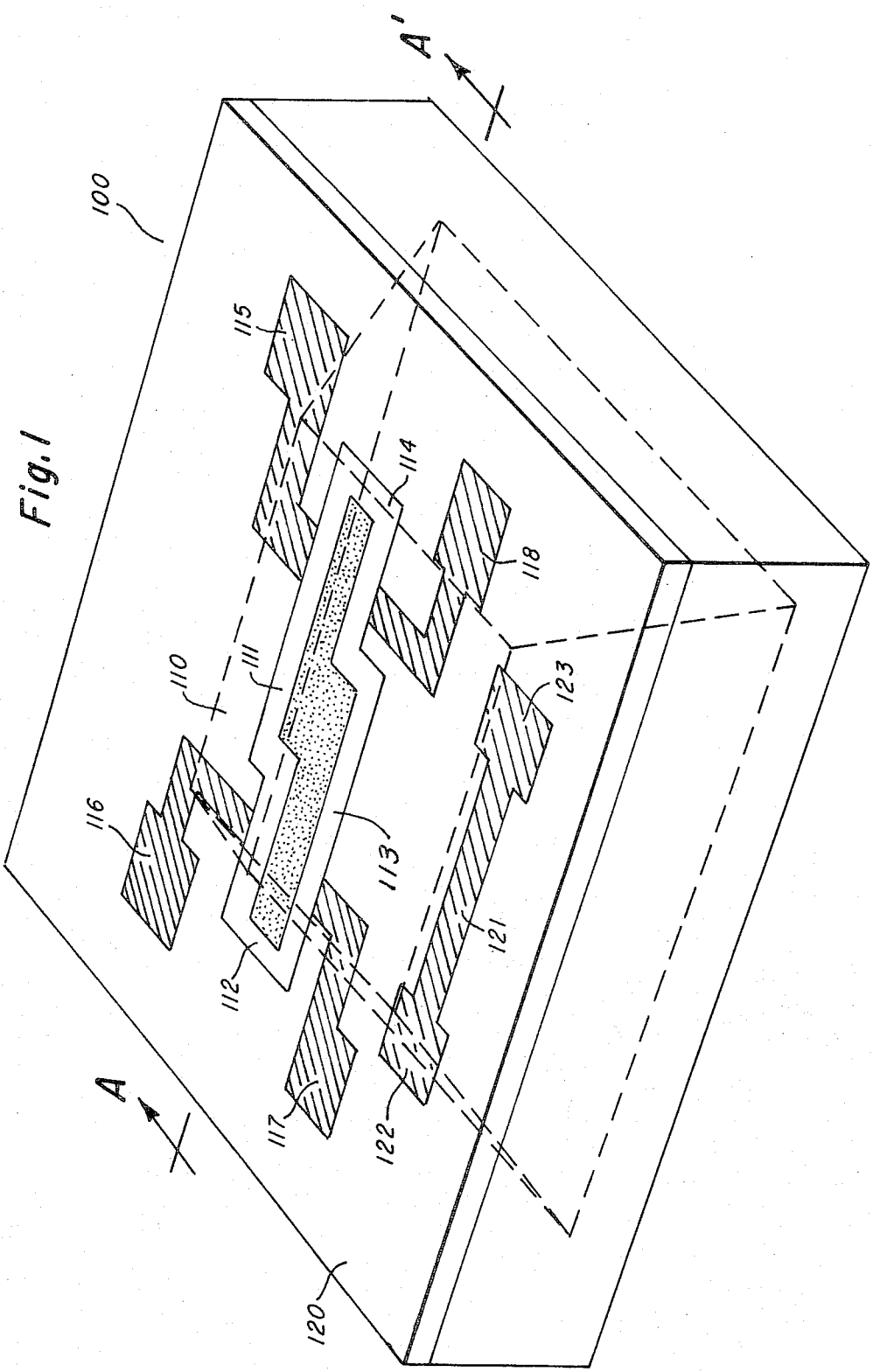
FIG. 1 is a perspective view of one embodiment of the present invention.

As illustrated in FIG. 1, the temperature compensated pressure sensor 100 of the present invention comprises two main portions, diaphragm portion 110 and clamp ring portion 120. The entire pressure sensor 100 including diaphragm portion 110 and clamp ring portion 120 is fashioned from a single silicon crystal. One part of the crystal is etched out in a manner which will be described more fully below to produce a thin, flexible diaphragm portion 110. This diaphragm portion 110 and the clamp ring portion 120 have impurities added thereto in order to obtain a semiconductor of a first type conductivity. Disposed in the diaphragm portion 110 are resistor elements 111, 112, 113 and 114 which are composed of semiconductor material of the opposite type conductivity. These resistor elements 111 to 114 are formed by implanting or diffusing the opposite type conductivity impurities into these sections of the diaphragm according to known techniques. Also disposed upon diaphragm portion 110 are metal contacts 115, 116, 117 and 118. Preferably, resistor elements 111 to 114 include contact tabs (not illustrated) provided for connection to metal contacts 115 to 118. These metal contacts are disposed on top of the pressure sensor 100 in any manner known in the art so that they are in ohmic contact with the contact tabs of the resistor elements of the opposite type conductivity.

Figure 2:
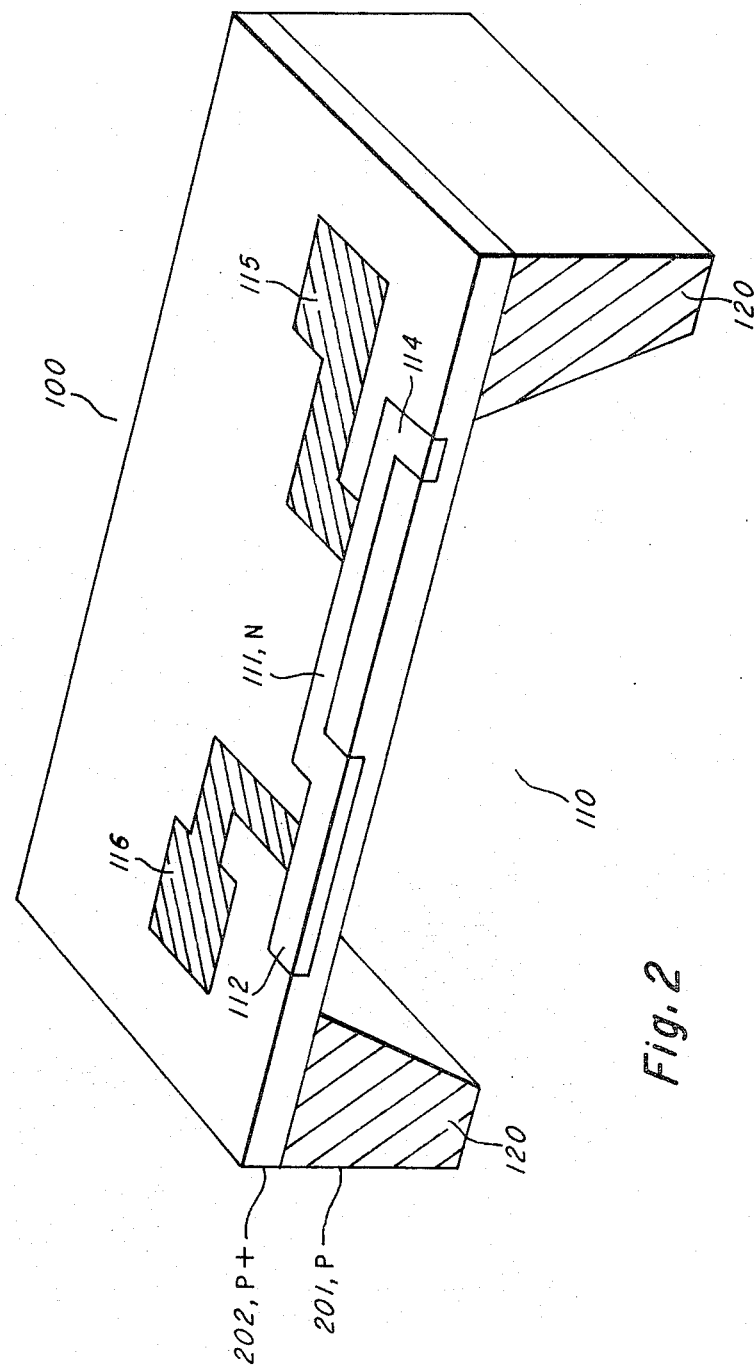
FIG. 2 is a perspective view of a cross section of the embodiment illustrated in FIG. 1 taken along the line A—A'.

As better illustrated in FIG. 2, clamp ring portion 120 is a thicker portion of the single crystal pressure sensor 100 which serves to support and stabilize the diaphragm portion 111. Also included in clamp portion 120 is temperature sensitive resistor 121 having ohmic contacts 122 and 123. Temperature sensitive resistor 120 can be formed in the same manner as resistor elements 111 to 114, that is, by diffusion or implantation of an impurity into the structure of pressure sensor 100 at that location in order to form a semiconductor region of the opposite type conductivity.

The structure illustrated in FIGS. 1 and 2 may be formed by a method which is described below. In this method, the starting point is a (100) crystal orientation P type substrate of silicon 201. A P+ layer 202 (that is, a P layer having a greater impurity concentration than the substrate) is epitaxially grown on top of the P type substrate 201. Next, a portion of the P substrate 201 opposite the epitaxially grown P+ layer 202 is etched to form the diaphragm portion 110. This is most advantageously performed using an orientation dependent etch (ODE). An ODE etchant has a different rate of etching along different axes of the silicon crystal. An etchant composed of a ethylene diamine-pyrocatechol and water mixture has a 100 to 1 ratio of etching rates across to against the (111) plane of the crystal. Employing this etchant, it is possible to mask only a small portion of the reverse side of the P type substrate 201 and the etchant automatically follows the (111) plane of the crystal to give the sloped sides illustrated in the cross sectional view FIG. 2. This etchant mixture has the further additional advantage that it is selective against P+ material and that it stops when reaching the P+ layer 202. Therefore, by careful control of the depth of the P+ layer 202 originally formed, it is possible to control the depth of the diaphragm thus formed. It should be clearly understood that the ratio of breadth to depth of the diaphragm portion must be matched with the particular pressure range desired. Specifically, a broader and thinner diaphragm is necessary when a small pressure differential is to be measured. Conversely, a narrower and thicker diaphragm must be employed when the pressure differential across the diaphragm portion is greater. The resistor elements 111, 112, 113, 114 and 121 may now be formed in the top surface of the structure, that is, within the P+ layer 202, by diffusion or implantation of an appropriate N type impurity using known techniques. This step may be performed prior to the ODE etching step, that is, the order of these two steps may be reversed. Next, a thin insulating oxide layer (not illustrated for the purpose of clarity) is formed on the P+ layer. Lastly, the metal contacts 115, 116, 117, 118, 122 and 123 are added to the top layer of the semiconductor structure using any known method.

The above described method for producing the semiconductor pressure sensor of the present invention has a disadvantage in the formation of the resistors of the second type conductivity. As described above, a P+ type epitaxial layer 202 is employed to define the diaphragm depth and is used to stop the ODE process from the reverse side of the semiconductor substrate 201. Formation of the resistor elements in this P+ layer 202 requires the addition of a large number of N type impurity atoms in order to overcome the large concentration of impurity atoms of the opposite type conductivity in P+ layer 202.

Figure 3:
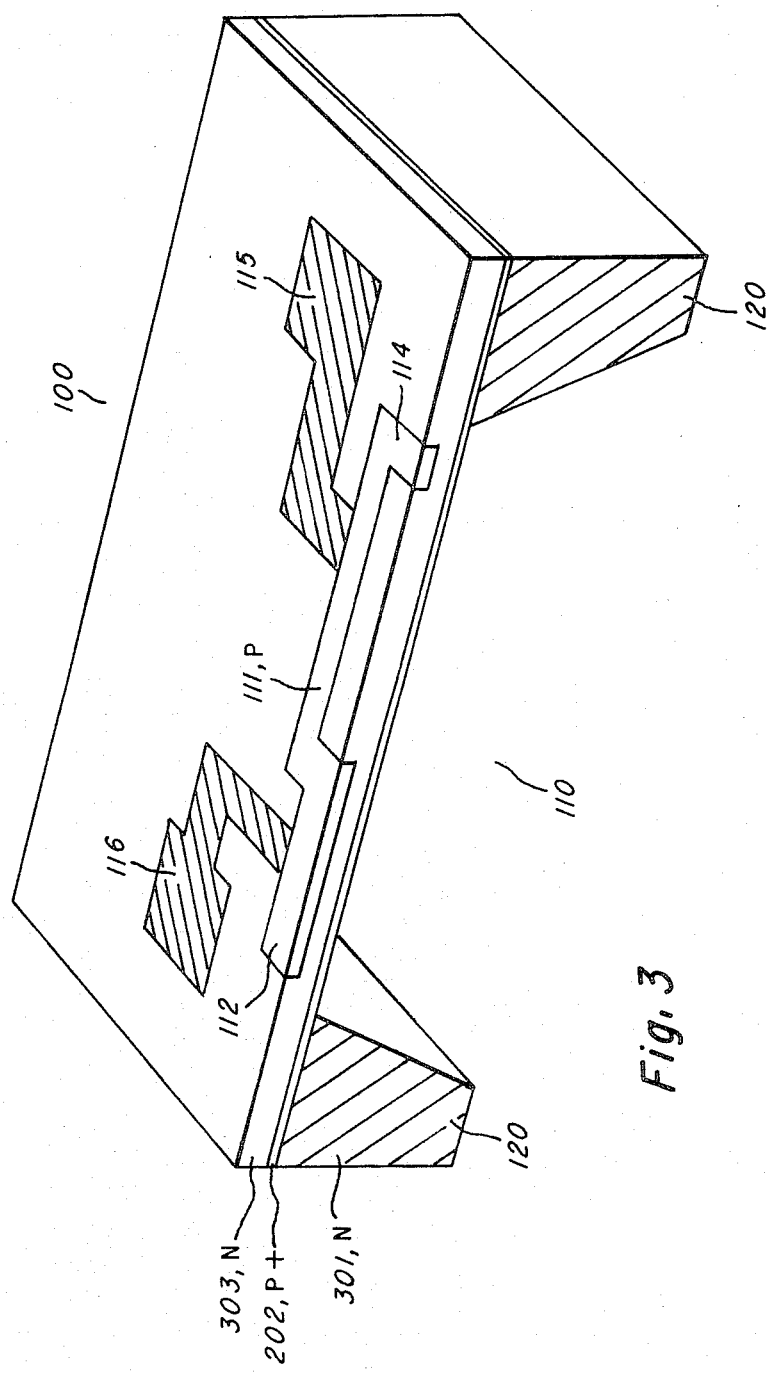
FIG. 3 is a perspective view of a cross section of a second embodiment of the present invention.

A second method for producing the pressure sensor structure of the present invention is proposed in order to reduce the number of atoms necessary to produce the resistor elements. A cross sectional view of the pressure sensor formed by this method is shown in FIG. 3. This process starts with a (100) crystal operation semiconductor substrate 301 of the N type. As in the previous method, a P+ layer 302 is epitaxially grown upon the top surface of the base semiconductor. Next, an N type epitaxial layer 303 is grown upon P+ layer 302. Note that P+ layer 302 and N layer 303 thus formed will together form the diaphragm and therefore the thickness of P+ layer 302 and N layer 303 together must equal the desired diaphragm depth. Also note that the N epitaxial layer 303 has a lower dopant concentration that the P+ layer 202 of the previous process, therefore having a higher resistivity. The reverse side of the semiconductor substrate 301 is etched out using an ODE technique as previously described. The resistor elements 111, 112, 113, 114 and 121 are formed in the N epitaxial layer 303 on the top of the semiconductor by adding an appropriate P type impurity. Note because the N type impurity concentration in N layer 303 is less than the P type impurity concentration in P+ layer 202 of the previous method, it is possible to achieve resistor elements of the desired conductivity with the addition of a smaller number of opposite type impurity atoms. Then a thin insulating oxide layer (not illustrated for the purpose of clarity) is formed atop the structure. Lastly, the metal contacts 115, 116, 117, 118, 122 and 123 are placed upon the semiconductor surface as described in the previous technique.

Figure 4:
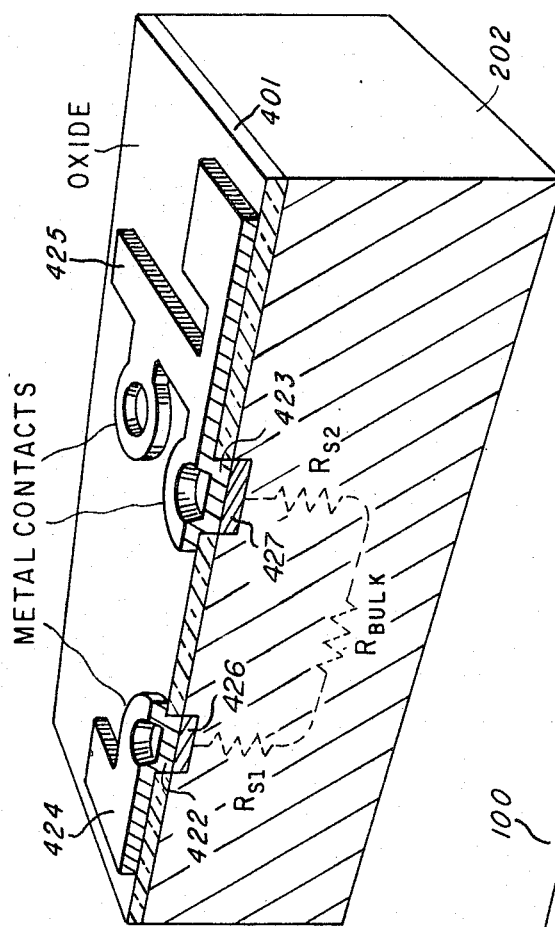
FIG. 4 is a perspective view of a cross section of a second embodiment of the temperature sensitive resistor.
Figure 5:
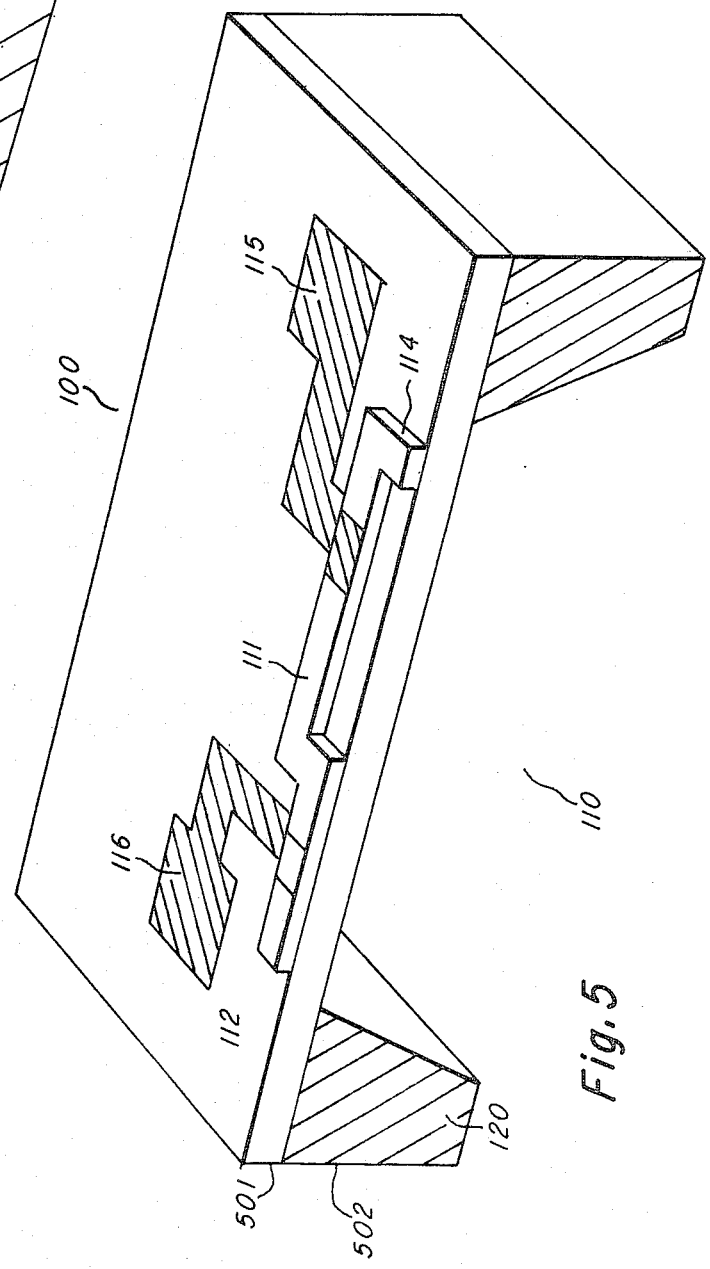
FIG. 5 is a perspective view of a cross section of a third embodiment of the present invention.

In the two production methods described above, the temperature sensitive resistor is described as embodied by an implanted resistor in the same manner as the piezoresistive elements. A simpler method of producing this temperature sensitive resistor is possible by following the technique disclosed in U.S. Pat. No. 3,936,789, issued to Matzen, Feb. 3, 1976. FIG. 4 illustrates this second embodiment of the temperature sensitive resistor in a pressure sensor formed in accordance with the embodiment illustrated in FIGS. 1 and 2. It is to be understood that this construction method is equally applicable to the embodiment of the pressure sensor illustrated in FIG. 3 with suitable modifications which will become readily apparent from the description below. In this embodiment, contact 122 comprises spreading resistance contact 422 in ohmic contact with the P+ layer 202 and conductive strip 424 which is insulated from the P+ layer 202 by oxide film 401. Similarly, contact 123 comprises spreading resistance contact 423 and conductive strip 425. In accordance with the disclosure of U.S. Pat. No. 3,936,789 spreading resistance contacts 422 and 423 are connected to P+ layer 202 via higher conductivity P++ layers 426 and 427, respectively. The resistance of the thus formed temperature sensitive resistor is the sum of the spreading resistance of contacts 422 and 423 and the bulk resistance of P+ layer 202 or $R_{S1} + R_{S2} + R_{Bulk}$. Due to the higher conductivity of P+ layer 202 as compared with P substrate 201, the later contributes little to the conductivity of the temperature sensitive resistor. In the case of the pressure sensor as illustrated in FIG. 3, the spreading resistance temperature sensor is constructed in much the same manner except that contacts 122 and 123 must be insulated from the upper N layer 303. The resistor thus formed has a temperature coefficient of resistance equal to the temperature coefficient of resistance of the P+ layer. As described in the above cited patent, this spreading resistance temperature sensitive resistor may include a plurality of spreading resistance contacts such as 422 and 423 with those spreading resistance contacts ultimately connected to contacts 122 and 123 selected in order to achieve the desired resistance. It must also be clearly understood that the spreading resistance temperature sensitive resistor must be positioned in the clamp ring portion of the pressure sensor in order to avoid stress from the diaphragm flexure and piezoresistive changes in resistance.

A third method for producing the semiconductor pressure sensor of the present invention employing a silicon carbide layer will now be described. The manufacturing process is begun with an N type semiconductor substrate. P type impurities are implanted or diffused into the semiconductor substrate in appropriate positions to form the resistor elements 111, 112, 113, 114 and 121. Next, a silicon carbide layer 501 is epitaxially grown on top of the semiconductor substrate over the thus formed P type resistor elements. This silicon carbide layer 501 should have a thickness equal to the desired diaphragm thickness. A polysilicon layer 502, that is, a layer of polycrystalline silicon is then formed on top of the silicon carbide layer 501. Then the structure is etched to completely remove the original N type substrate but leaving the P type resistor elements. Then the metal terminals 115, 116, 117, 118, 122 and 123 are formed on the semiconductor structure to form the terminals for the Wheatstone bridge and the temperature sensitive resistor. Lastly, the central portion of the polysilicon layer 502 on the silicon carbide layer 501 is removed employing a planar etch. During this process the silicon carbide layer 501 serves as an etch stop. When this process is completed, the remaining portions of the polysilicon layer 502 form the clamp ring portion and the silicon carbide 501 layer, having resistor elements 111, 112, 113, 114 and 121 formed on one surface, serves as the diaphragm portion. Of course, it is understood that temperature sensitive resistor 121 is disposed on a portion of the periphery of silicon carbide layer 501 supported by polysilicon layer 502 in order to prevent stress and piezoresistivity in resistor 121.

Figure 6:
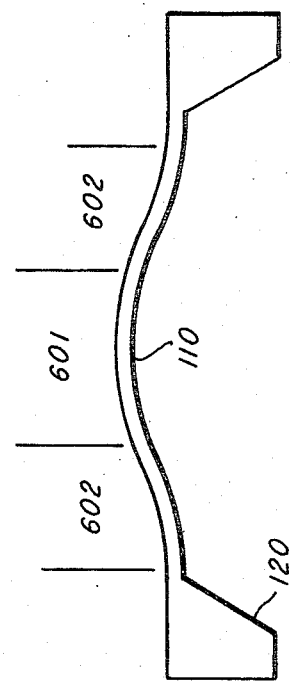
FIG. 6 is a cross sectional view of the structure illustrated in FIG. 1 illustrating diaphragm flexure.

The placement of the resistor elements on the diaphragm is important for determination of the type of strain they receive due to pressure differences across the diaphragm and therefore the magnitude and direction of the piezoresistive change in these resistors. The previously cited Gieles reference clearly recognizes that the nature of the stress on the diaphragm differs according to the position on the diaphragm. This can be understood by study of the flexed diaphragm illustrated in FIG. 6, in which the diaphragm displacement is exaggerated for better understanding. For example, assuming that the resistive elements are formed on the top of diaphragm portion 110 and that there is a greater pressure on the bottom of the diaphragm than the top, the central portion 601 of the diaphragm bulges upward as shown in FIG. 6. This causes those resistor elements formed on the central portion 601 of the diaphragm of undergo elongation stress causing a piezoresistive effect in one direction. On the other hand, resistor elements located at the peripheral portion 601 of the diaphragm are caused to undergo a compression stress under the assumed conditions, thereby exhibiting a piezoresistive change in the opposite direction. Naturally, the nature of the stresses involved and the direction of the piezoresistive change would be reversed in the case that the excess pressure appears at the top of the diaphragm. Thus, it is seen that a resistor element disposed in the central portion 601 of the diaphragm undergoes a different polarity of stress from a resistor element located in the peripheral portion 602 of the diaphragm. Thus, in the case a single resistor element is employed in the device of the present invention, it must be placed either entirely within the central portion 601 or entirely within the peripheral portion 602 in order to undergo only one polarity of stress, thereby avoiding cancellation of the piezoresistive effect occurring in one part of the resistor by that occurring in another part of the resistor.

As recognized in the previously cited Gieles reference, this difference in the polarity of the stress in the diaphragm at different portions of the diaphragm can be employed to increase the sensitivity of the pressure measurement. Resistor elements 111 and 113 are disposed in the central portion 601 of the diaphragm. Resistor element 112 and 114 are disposed in the peripheral portion 602 of the diaphragm. Together with the ohmic contacts 115 to 118, these resistor elements form a Wheatstone bridge. Note that ohmic contacts 115 to 118 are formed so as to be in contact with the resistor elements in positions as near as practical to points of inflection of the diaphragm, that is, to positions where the diaphragm stress and hence any piezoresistive effect is minimal. The resistance measurement is made by applying a voltage source across two opposite terminals such as terminals 115 and 117 and measuring the voltage across the other two opposite terminals 116 and 118. Because of the resistances of resistor elements 111 to 114 are initially equal, the initial voltage between terminals 116 and 118 is 0. When the diaphragm is stressed, for instance, when the pressure below the diaphragm is greater than that above, as shown in FIG. 6, resistors elements 111 and 113 are elongated and resistor elements 112 and 114 are compressed. This causes the resistances of resistor elements 111 and 113 to change in the opposite direction from the change in the resistance of resistor elements 112 and 114. Thus, the voltage appearing at terminal 116 changes in the opposite direction from the voltage appearing at terminal 118.

This can be easily shown by simple calculation. Suppose that the voltage applied across terminals 115 and 117 is $V_I$. Then the voltage appearing at terminal 116 ($V_{116}$) is:

$$V_{116} = V_I \frac{R_{112}}{R_{111} + R_{112}} \quad (1)$$

where $R_{111}$ and $R_{112}$ are the resistances of resistor elements 111 and 112, respectively. Similarly, the voltage appearing on terminal 118 ($V_{118}$) is given by:

$$V_{118} = V_I \frac{R_{113}}{R_{113} + R_{114}} \quad (2)$$

where $R_{113}$ and $R_{112}$ are the resistance of resistor elements 113 and 114, respectively. The voltage appearing between terminals 116 and 118 ($V_0$) is the difference of these two amounts:

$$V_0 = V_{116} - V_{118} = V_I \frac{R_{112}}{R_{111} + R_{112}} - \quad (3)$$

-continued $$V_I \frac{R_{113}}{R_{113} + R_{114}}$$

This can be simplified as:

$$V_0 = V_I \frac{R_{112} R_{114} - R_{111} R_{113}}{(R_{111} + R_{112})(R_{113} + R_{114})} \quad (4)$$

The multiplier effect of the Wheatstone bridge circuit can be seen from a study of formula (4). Note that resistor elements 111 and 113 are both disposed in the center of the diaphragm and therefore exhibit piezoresistive changes in the same direction. Similarly, because resistor elements 112 and 114 are both disposed in the periphery of the diaphragm, they also exhibit piezoresistive changes in the same direction, and this direction of piezoresistive change is opposite to the direction of piezo-resistive change in resistors 111 and 113. It can be seen that the denominator of the fraction in formula (4) remains relatively constant when the diaphragm is flexed. This is because each of the factors in the denominator remain relatively constant. Note that resistances $R_{111}$ and $R_{114}$ change in opposite directions when the diaphragm is flexed, thereby keeping their sum relatively constant. This is also the case for resistances $R_{112}$ and $R_{113}$ thereby keeping their sum relatively constant. For this reason, the denominator of the fraction in formula (4) remains relatively constant despite the piezoresistivity of resistor elements 111 to 114. The same case is not true for the numerator of this fraction. Note that resistances $R_{111}$ and $R_{113}$ both change in the same direction and therefore their product changes to a greater degree in this same direction. Similarly, resistances $R_{112}$ and $R_{114}$ change in the same direction, this direction being opposite to the direction of change of resistances $R_{111}$ and $R_{112}$ and therefore their product greatly diverges from the product of $R_{111}$ and $R_{113}$. Initially, resistor elements 111, 112, 113 and 114 are formed so that their resistances are equal, that is, $R_{111}=R_{112}=R_{113}=R_{114}$. Thus, in the quiescent state, $V_0=0$. Upon flexure of the diaphragm, $V_0$ changes from this balance condition. The sign of $V_0$ indicates whether the pressure at the top surface of the diaphragm is greater than the pressure on the bottom surface or vice versa. The absolute magnitude of $V_0$ is a measure of the pressure differential between the top surface and the bottom surface of the diaphragm.

As explained above, the major difficulty with piezoresistive pressure sensing elements such as just described is their temperature sensitivity. This temperature sensitivity is exhibited in two ways. Firstly, the resistance of any semiconductor resistor is temperature dependent. This temperature dependence may take two forms, intrinsic and extrinsic, depending upon the impurity concentration and the specific temperature. Silicon has an intrinsic negative temperature coefficient of resistance, that is, the resistance tends to decrease for increasing temperature. The same semiconductor may also exhibit an extrinsic positive temperature coefficient depending upon the impurity concentration and the temperature. This extrinsic temperature coefficient region is determined by the particular impurity concentration. These factors are particularly important in a piezoresistive pressure sensor having but a single resistor element. In such a case, the piezoresistive effect may be masked by the temperature dependence of the resistance of the resistor element. The effect of this temperature dependence of the resistance of individual resistor elements is largely cancelled out by employing the Wheatstone bridge arrangement described above. However, there is a second factor affecting the piezoresistive pressure measurement. Not only is the resistance of individual resistor elements temperature dependent, but also the piezoresistive coefficients are temperature dependent. That is, a given mechanical stress will produce different piezoresistive changes in the resistor elements depending upon the temperature. This latter form of temperature sensitivity is not corrected by the use of the Wheatstone bridge circuit described above. It is because these piezoresistive coefficients are temperature dependent that the present invention employing an on-chip temperature sensitive element is proposed.

Figure 7:
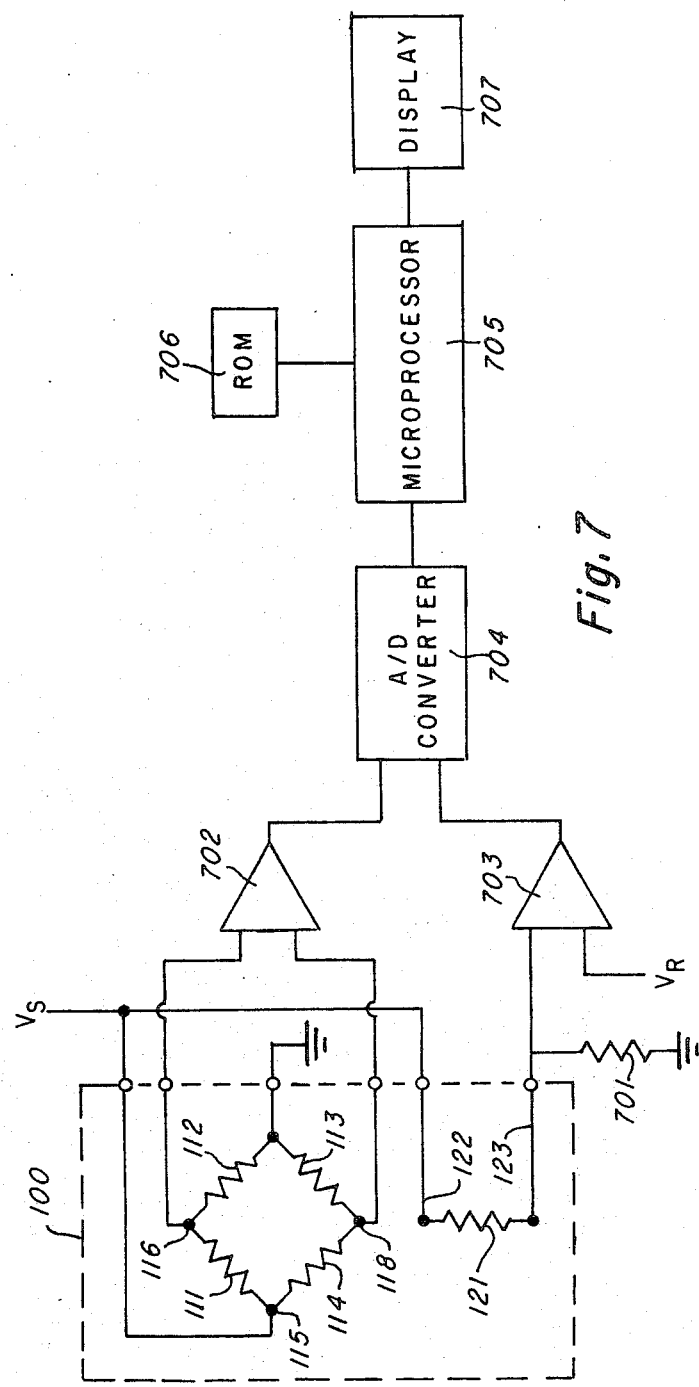
FIG. 7 is a block diaphragm of a microprocessor external temperature compensation circuit for use with the pressure sensor of the present invention.

A preferred system including the pressure sensor of the present invention is illustrated in FIG. 7. Note the left hand portion of FIG. 7 is an electrical schematic diagram of pressure sensor 100 including resistors 111, 112, 113, 114 and 121 and terminals 115, 116, 117, 118, 122 and 123. A voltage $V_S$ is applied across terminals 115 and 117 of the piezoresistor Wheatstone bridge circuit. The voltage at terminals 116 and 118 are applied to differential amplifier 702 which produces a signal indicative of the pressure. As noted above, this signal is also temperature sensitive due to the temperature dependence of the piezoresistive coefficients. The voltage $V_S$ is also applied across the series connection of temperature sensitive resistor 121 and reference resistor 701. The voltage at the junction of resistor 121 and 701 is applied to differential amplifier 703 where it is compared with a reference voltage $V_R$. The output of differential amplifier 703 is proportional to the resistance of temperature sensitive resistor 121 and hence is indicative of the temperature of pressure sensor 100.

The outputs of differential amplifiers 702 and 703 are applied to A/D converter 704. A/D converter 704 digitizes the information in the signals from differential amplifiers 702 and 703 into a form for processing by microprocessor 705. Read only memory (ROM) 706 contains a look-up table which relates specific pairs of signals from comparison amplifiers 702 and 703 with the particular pressure applied to pressure sensor 100. The data stored in ROM 706 would be initially determined by testing a sample pressure sensor 100 at various predetermined pressures and temperatures while measuring the corresponding outputs of comparison amplifiers 702 and 703. Due to the high repeatability of manufacture of pressure sensor 100 employing the semiconductor technology previously described, this pretesting to determine the data to be stored in ROM 706 need be performed only for a single sample of any particular specific pressure sensor structure. Thus, ROM 706 would store a plurality of points $P_{nm}$ ($T_n$, $B_n$) where $P_{nm}$ is the actual pressure for a temperature $T_n$ from the temperature sensitive resistor and a pressure indicative signal $B_m$ from the Wheatstone bridge, the range of temperature and pressure indicative signals covering the useful range of that specific pressure sensor. The microprocessor 705 is ideally programmed to interpolate the pressure function between stored values. Taking a linear approximation assuming the slope along the pressure function from $P_{11}$ ($T_1$, $B_1$,) to $P_{nm}$ ($T_n$, $B_m$) is the same as the slope along the major diagonal of the functional cell $P_{11}$ ($T_1$, $B_1$), $P_{12}$ ($T_1$, $B_2$), $P_{21}$ ($T_2$, $B_1$) and $P_{22}$ ($T_2$, $B_2$) yields:

$$P_{out} = [P_{22}(T_2, B_2) - \qquad (5)$$

$$P_{11}(T_1, B_1)] \sqrt{\frac{(T_n - T_1)^2 + (B_m - B_1)^2}{(T_2 - T_1)^2 + (B_2 - B_1)^2}} + P_{11}(T_1, B_1)$$

where:
$P_{out}$ is the interpolated output value from equation (5);
$P_{11}$ ($T_1$, $B_1$) is the ROM stored pressure value for a temperature of $T_1$ and a pressure indicator of $B_1$;
$P_{22}$ ($T_2$, $B_2$) is the ROM stored pressure value for a temperature of $T_2$ and a pressure indicator of $B_2$;
$T_n$ is the measured temperature, $T_1 < T_n < T_2$; and
$B_m$ is the measured pressure indicator $B_1 < B_m < B_2$.

Microprocessor 705 then converts the interpolated pressure output value $P_{out}$ into the form required for display 707 and display 707 indicates the pressure measured by pressure sensor 100.

As described above, the temperature sensitive resistor element is disposed on the same semiconductor chip and is in close physical proximity to the piezoresistive elements. In addition, in the first and second disclosed methods for producing the structure of this invention, the temperature sensitive resistor is a part of the same single crystal silicon structure as the piezoresistive resistor elements. Therefore, the temperature measured by the temperature sensitive resistor is the same as the temperature at the piezoresistive elements. Using the temperature measured by the temperature sensitive resistor, it is possible to correct the electrical measure of the pressure provided by one or more piezoresistive elements and thereby provide a more accurate measure of the actual pressure.

What is claimed is:

1. A thermally compensated silicon pressure sensor comprising:
   (a) a single crystal of silicon including:
      (1) a diaphragm portion with a top surface and a bottom surface, having a thickness permitting flexure when a pressure differential is applied between said top surface and said bottom surface and having a continuous loop resistor element disposed adjacent to said top surface in a position for exhibiting piezoresistivity when said diaphragm is flexed, a first resistor disposed in a central portion of said diaphragm portion, a second resistor connected to said first resistor and disposed in a peripheral portion of said diaphragm portion, a third resistor connected to said second resistor and disposed in a central portion of said diaphragm portion and a fourth resistor connected to said first and third resistors and disposed in a peripheral portion of said diaphragm portion; and
      (2) a clamp ring portion disposed around the entire perimeter of said diaphragm portion having a thickness providing mechanical support to said diaphragm portion and permitting virtually no flexure of said clamp ring portion when a pressure differential is applied between said top surface and said bottom surface of said diaphragm portion, and further having a temperature sensitive resistor disposed therein;
   (b) a first set of electrical terminals including a first electrical terminal disposed in ohmic contact with said continuous loop resistor element at the connection between said first and second resistors, a second electrical terminal in ohmic contact with said continuous loop resistor element at the connection between said second and third resistors, a third electrical terminal in ohmic contact with said continuous loop resistor element at the connection between said third and fourth resistors and a fourth electrical terminal disposed in ohmic contact with said continuous loop resistor element at the connection between said first and fourth resistors; and
   (c) a second set of electrical terminals disposed in ohmic contact with said temperature sensitive resistor.

2. A thermally compensated silicon pressure sensor as claimed in claim 1, wherein:
   said temperature sensitive element comprises a resistor region adjacent to a surface of said clamp ring portion having a conductivity type opposite to the conductivity type of the surrounding clamp ring portion; and
   said second set of electrical terminals comprises a fifth electrical terminal and a sixth electrical terminal disposed in ohmic contact with said resistor region.

3. A thermally compensated silicon pressure sensor as claimed in claim 1, wherein:
   said second set of electrical terminals comprises a fifth electrical terminal including at least one spreading-resistance thin-film metal contact to said clamp ring portion and a sixth electrical terminal including at least one spreading-resistance thin-film metal contact to said clamp ring portion; and
   said temperature sensitive element comprises the bulk resistance of said clamp ring portion between said fifth and sixth electrical terminals.

4. A thermally compensated silicon pressure sensor as claimed in claim 1, further comprising:
   a sensor package connected to said clamp ring portion having a first port for applying a first pressure to said top surface of said diaphragm portion and a second port for applying a second pressure to said bottom surface of said diaphragm portion.

5. A thermally compensated silicon pressure sensor as claimed in claim 1, further comprising:
   a sensor package connected to said clamp ring portion having a chamber enclosing one of said surfaces of said diaphragm portion at a fixed pressure and a port for applying a pressure to the other of said surfaces of said diaphragm portion.

6. A thermally compensated silicon pressure sensor comprising:
   a silicon carbide diaphragm having a top surface and a bottom surface and a thickness permitting flexure when a pressure differential is applied between said top surface and said bottom surface;
   at least one doped silicon resistor element disposed on said top surface of said diaphragm in a position for exhibiting piezoresistivity when said diaphragm is flexed;
   a polycrystalline silicon clamp ring disposed on the peripheral portion of the bottom surface of said diaphragm around the entire perimeter of said diaphragm having a thickness providing mechanical support to said diaphragm and permitting virtually no flexure of said clamp ring when a pressure differential is applied between said top surface and said bottom surface of said diaphragm; and a doped silicon temperature sensitive resistor element disposed on the peripheral portion of the top surface of said diaphragm opposite to said clamp ring.

7. A thermally compensated silicon pressure sensor as claimed in claim 6, further comprising:
   a first set of electrical terminals disposed on said diaphragm portion in ohmic contact with said at least one resistor element; and
   a second set of electrical terminals disposed in ohmic contact with said temperature sensitive resistor element.

8. A thermally compensated silicon pressure sensor as claimed in claim 7, wherein:
   said at least one resistor element comprises a continuous loop resistor element having a first resistor disposed on a central portion of said diaphragm, a second resistor connected to said first resistor and disposed on a peripheral portion of said diaphragm, a third resistor connected to said second resistor and disposed on a central portion of said diaphragm and a fourth resistor connected to said first and third resistors and disposed on a peripheral portion of said diaphragm; and
   said first set of electrical terminals comprises a first electrical terminal disposed in ohmic contact with said continuous loop resistor element at the connection between said first and second resistors, a second electrical terminal disposed in ohmic contact with said continuous loop resistor element at the connection between said second and third resistors, a third electrical terminal disposed in ohmic contact with said continuous loop resistor element at the connection of said third and fourth resistor and a fourth electrical terminal disposed in ohmic contact with said continuous loop resistor element at the connection of said first and fourth resistor.

9. A thermally compensated silicon pressure sensor as claimed in claim 7, further comprising:
   a sensor package connected to said clamp ring having a first port for applying a first pressure to said top surface of said diaphragm and a second port for applying a second pressure to said bottom surface of said diaphragm.

10. A thermally compensated silicon pressure sensor as claimed in claim 7, further comprising:
    a sensor package connected to said clamp ring having a chamber enclosing one of said surfaces of said diaphragm at a fixed pressure and a port for applying a pressure to the other of said surfaces of said diaphragm.

* * * * *